United States Patent [19]

Bhatia

[11] Patent Number: 5,163,551

[45] Date of Patent: Nov. 17, 1992

[54] INTEGRATED CIRCUIT DEVICE CARRIER

[75] Inventor: Ram D. Bhatia, Waltham, Mass.

[73] Assignee: Digital Equipment Corporation, Maynard, Mass.

[21] Appl. No.: 724,413

[22] Filed: Jun. 28, 1991

[51] Int. Cl.⁵ ............................................. B65D 73/02
[52] U.S. Cl. .................................... 206/334; 206/328; 361/212
[58] Field of Search ............... 206/328, 329, 331, 334; 361/212, 220

[56] References Cited

U.S. PATENT DOCUMENTS

| 3,048,668 | 8/1962 | Weiss ................................. 206/328 |
| 3,615,006 | 10/1971 | Freed ................................. 206/328 |
| 4,109,788 | 8/1978 | Hirose et al. ....................... 206/329 |
| 4,241,829 | 12/1980 | Hardy . | |
| 4,327,832 | 5/1982 | de Matteo . | |
| 4,435,724 | 3/1984 | Ralstin . | |
| 4,463,851 | 8/1984 | Cecil . | |
| 4,494,651 | 1/1985 | Malcolm . | |
| 4,564,880 | 1/1986 | Christ et al. . | |
| 4,754,880 | 7/1988 | Tehrani . | |
| 4,815,596 | 3/1989 | Reid . | |
| 4,823,952 | 4/1989 | Fletcher et al. ..................... 206/328 |
| 4,841,630 | 6/1989 | Lubranski et al. .................. 206/328 |
| 4,869,674 | 9/1989 | Pfaff . | |
| 4,881,639 | 11/1989 | Matsuoka et al. . | |
| 4,991,714 | 2/1991 | Clatanoff . | |
| 5,054,610 | 10/1991 | Ajello ................................. 206/5.1 |

OTHER PUBLICATIONS

W. J. Pinckney et al. "Self-Pressurized Container with Pressure Clamp" Apr. 1973, IBM Bulletin, vol. 15, No. 11.

J. J. Egan et al "Integrated Circuit Shipping Package" Western Electric Technical Digest, Apr. 1975 No. 30.

Primary Examiner—David T. Fidei
Attorney, Agent, or Firm—William P. Skladony; Ronald E. Myrick; Barry N. Young

[57] ABSTRACT

This invention relates to a carrier for transporting integrated circuit devices. In particular, the carrier is configured to cradle devices which have preformed leads which usually extend around the perimeter of the device and tend to be fairly fragile. The carrier is made up of a carrier top and a carrier bottom, which are securely closed through the attachment of several spring clamps. The bottom provides a secure nest which is configured to the shape of the body of the device. The top includes a hold-down member which houses two rings, a compression ring and a contact ring, within a channel. The compression ring is made of a rubber like material that can elastically compress under contact pressure, while the contact ring is made of a hard material, which will not stick to the top of the device. The contact ring, which is positioned between the compression ring and the device, engages the device when the carrier top and the carrier bottom are mated. As a consequence of its abutting relationship with the compression ring and the resilient qualities of the compression ring, the contact ring will have a tendency to urge the device to remain securely seated in the nest. Thus, the device, including its fragile preformed leads, will remain undamaged even though the carrier may be subject to various physical forces that are common in a robust transportation environment.

22 Claims, 2 Drawing Sheets

INTEGRATED CIRCUIT DEVICE CARRIER

FIELD OF THE INVENTION

This invention relates to an apparatus for transporting integrated circuit devices in a robust transportation environment, and more particularly it relates to an apparatus that can be used for the safe transport, storage, and assembly line removal of devices which have preformed leads.

BACKGROUND OF THE INVENTION

Integrated circuit ("IC") devices are generally designed to have a molded plastic or ceramic packaging inside of which an electronic chip is housed. The package of modern generations of such IC devices are usually a flat rectangular shape, although some may have a flat, disk shaped, heat sink positioned on its top surface. In addition, IC devices typically have a plurality of tiny, fragile, conductive leads protruding out of the four sided perimeter of the package. The leads are wired to the electronic chip inside the packaging, and they form the electrical contacts by which the chip is connected to some external circuitry, often a printed circuit board.

After an IC device is formed, it often must be transported from the place of manufacture to the place where it will be integrated into a higher level assembly, such as the mounting of the IC device onto a printed circuit board. During transportation the device may be exposed to physical conditions, such as bumping, dropping, and vibration, which can damage the device if it is not properly protected. In particular, the fragile leads must be protected against being physically bent because the precise alignment of each lead is critical to successfully mounting the IC device on a printed circuit board. Such bending could easily occur if the IC device were to move around inside a transportation carrier as a result of the physical forces to which the carrier is ordinarily exposed while in transit.

The protection of the leads is especially important for IC devices which have the leads preformed so that they can be taken directly from the carrier in which they were transported and mounted onto the printed circuit board through an automated assembly operation that usually involves the use of robots. Such preformed, ready-to-be-mounted leads tend to be much more fragile and easily damaged than other leads that are formed, or bent, after they are transported to the board assembly site.

IC device carriers known in the art typically have a boxlike carrier with a nest for seating the body portion of the device and some means for keeping the body firmly seated in the nest during transportation. As shown in U.S. Pat. No. 4,881,639, issued to Matsuoka et al. on Nov. 21, 1989, one IC device is seated in an accommodating section. It is held in position by four engaging claws which hold the four corners of the device. The engaging claws are mounted on torsion bars which twist to enable the device to be inserted and extracted from the carrier. One disadvantage of this approach is that the engaging claws must be precisely configured to mate with and secure the four corners of the IC device. Therefore, changes in the device configuration, which have the effect of moving the leads closer to the corners of the device, may necessitate the reconfiguration of the carrier, if the positioning of the original claws causes interference with the new lead positions.

In fact, many successive generations of IC devices have demonstrated a general progression toward increasing the number of leads, which is referred to as the "pin count", on such devices. Increasing the pin count has a tendency to move the leads closer to the corners of the device because more leads are packed into the same amount of perimeter space. Consequently, the carrier shown in Matsuoka may also have the disadvantage that successive generations of devices may have less corner space by which the chip may be grasped by the engaging claws. With less space available, the contact portion of the engaging claws will have to be made smaller, which may make it less reliable and more subject to breakage.

Another carrier, shown in U.S. Pat. No. 4,564,880, issued to Christ et al. on Jan. 14, 1986, similarly provides a nest like structure, generally referred to as a "retainer", positioned in the bottom section of the carrier for the seating of the body of the device. In this instance, the device is clamped in place between a supporting lip and the hemispherically shaped tip of a holding pedestal. This approach relies upon the spring action produced by the resilience of the material from which the carrier is constructed to keep the IC device clamped between the holding pedestal and the support lip.

According to Christ, when the body of the IC device is exposed to moderate external forces, those forces tend not to harm the IC because the body possesses the material property of rigidity. On the other hand, the tip of the hemisphere of the carrier shown in Christ is the only point of contact on one side of the device for holding the device in place, and it provides a point about which the body of the IC device may pivot. Therefore, if the carrier shown in Christ was exposed to robust transportation conditions, the pivot point of the tip together with the resilient characteristics of the material out of which the carrier is made could result in the device unseating itself from the nest.

What is needed, therefore, is an IC device carrier which is capable of protecting the device during transportation in a robust environment, and overcomes the disadvantages of the prior art.

SUMMARY OF THE INVENTION

The present invention relates to a carrier for transporting IC devices which have preformed leads. The carrier is comprised of a top and bottom section, which can be configured to hold a number of IC devices. The bottom of the carrier has a nest for each one of the devices. The nest is configured for receiving the body of the device therein, and the walls of the nest restrict the lateral movement of the IC device. The nest is also configured for enabling the leads of the device to extend freely into the open space beyond the perimeter of the walls of the nest to prevent contact with any object, which may have a tendency to damage or deform them.

The carrier top has a hold-down member for each one of the IC devices, which is configured to hold down each device from the top, when the top of the carrier is mated with the bottom of the carrier. Each hold-down member includes two coaxially arranged, cylindrically shaped sleeves, one having a larger diameter than the other. Together they form an annular channel in which two rings, a compression ring and a contact ring, are positioned.

The compression ring is positioned in the inner most recess of the channel and is made of a rubber-like material. The contact ring, on the other hand, is positioned so that one of its sides is in abutting contact with the compression ring, while the other side extends below the bottom, coplanar edges of the sleeves. As such, when the carrier top is mated with the carrier bottom the contact ring will engage the top central portion of the device, which is seated in the nest, and will generally evenly distribute the compressive force over a given surface area which is symmetric about the center point of the top of the device. That physical engagement will cause the contact ring to compress against the abutting compression ring. Due to the rubber-like qualities of the compression ring, the compression ring acts as a shock and vibration absorber, which keeps the contact ring engaged with the top of the device tending to urge the device to remain securely positioned in the nest.

The combined effect of the support provided by the nest and the distributed, compressive force of the hold-down member will keep the IC device stationary within the carrier during transportation. Accordingly, the device overall, and the leads in particular, will be protected against damage.

An object of the present invention is to provide a carrier device which holds the IC device in its nest by securing the top central portion of the device, rather than by securing the limited space available in the corners of the device. A feature of the present invention is that it uses a ring shaped structure which engages the top of the device and distributes a compressive force over a given surface area. An advantage of the invention is that the ring generally evenly distributes the compressive force over a great enough area to prevent the unseating of the device even when the carrier is exposed to robust transportation conditions. Another advantage of the invention is that it eliminates the need to precisely configure the hold-down structure to mate with the free, but limited, space available in the corners of the IC device. Consequently, a given configuration of the carrier may be suitable for use with different devices.

Other objects, features, and advantages of the invention will be further appreciated and better understood upon consideration of the detailed description of the preferred embodiment, presented in conjunction with the accompanying drawings below.

DETAILED DESCRIPTION OF THE PREFERRED EMBODIMENT

The present invention is a carrier apparatus for IC devices which have preformed leads. Given that the leads are preformed, the device can be taken from the carrier and directly mounted onto a printed circuit board. In the preferred embodiment, the carrier is integrated into an automated assembly line operation by having the carrier advanced through the assembly line and having the IC device lifted out of the bottom half of the carrier by a robot which will then place the device on a printed circuit board. Therefore, after the device is transported to the site where it will be mounted on the printed circuit board, there is no need to remove the IC device from the carrier and place it in some other transport device which advances through the assembly process.

Moreover, because the leads are preformed before the device is transported the leads are very fragile and can be easily bent or damaged. This is unlike unformed leads which are often physically connected to one another through a plastic or metal strip, referred to as a "tie bar", which gives such unformed leads greater physical integrity. Even a very slight deformation of a preformed lead must be prevented given that each lead is precisely aligned for engagement with a corresponding contact pad on the printed circuit board. The slightest misalignment may cause a flawed connection with the board. This, of course, has a degrading effect on the productivity of the automated assembly system.

Figure 1:
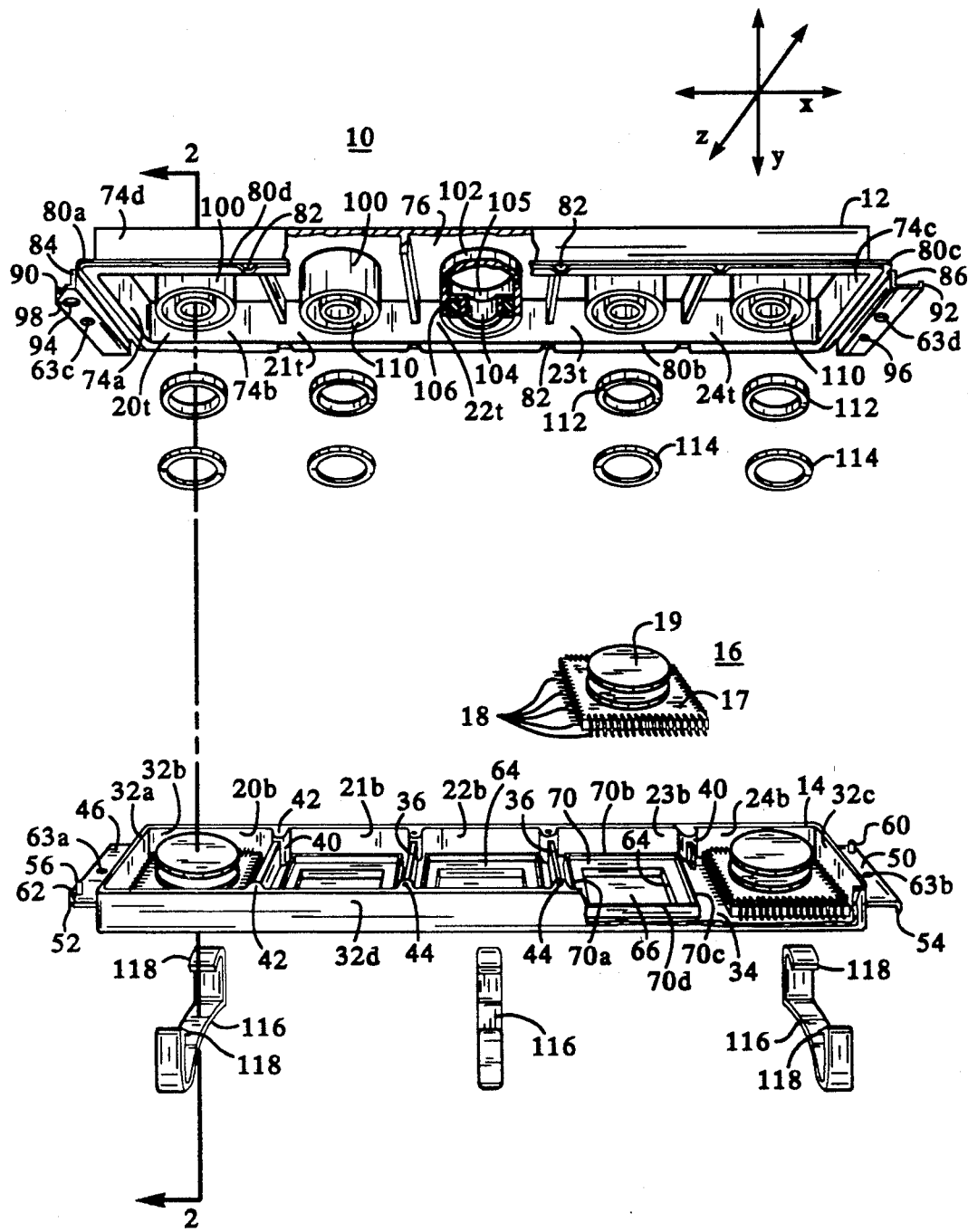
FIG. 1 is an exploded, partly sectioned, isometric drawing of an integrated circuit device carrier in accordance with the present invention.

Referring now to FIG. 1, carrier 10 in accordance with the present invention is shown in an exploded, partly sectioned, isometric view. Carrier 10 is an elongated, generally rectangular, box-like enclosure made up two matingly configured enclosure members: carrier top 12 and carrier bottom 14. To the extent that the electronic components transported in carrier 10 are sensitive to static charges, carrier 10 is made of a conductive material so that it will dissipate any charge to which it is exposed. Polycarbonate resin has been found to be a suitable material for this application; however, other materials may be used.

It should be noted that throughout the following detailed description a number of terms suggesting direction and position—such as vertical, horizontal, upward, downward, top and bottom—are used. Such references are based on the orientation of the carrier or the IC devices in a particular Figure with the carrier positioned flatly, right-side-up in the horizontal plane. To more concretely establish position and direction, FIGS. 1 and 2 include orientation keys showing an x axis, y axis, and z axis, with the x-z axes defining a horizontal plane and the x-y axes defining a vertical plane. Position and direction references, however, should not be taken as a limitation of the application of the invention, as the invention is suitable for use in many different physical orientations, and such directional references are for convenience of discussing one embodiment of the invention.

As shown in FIG. 1, carrier 10 is configured to transport IC devices 16. Each device 16 is made up of a body 17, with a plurality of leads 18 extending around the rectangular perimeter of body 17. In addition, each device 16 has a disk shaped heat sink 19 positioned on the upper surface of body 17. It will be clear to those skilled in the art that although this embodiment of the invention can accommodate devices 16 with heat sinks 19, the invention is readily adapted for use with devices 16 that are many different shapes and sizes, including those that do not have any heat sinks 19.

In this embodiment, carrier 10 has five distinct, but generally identical, compartments in which one device 16 may be positioned. Only three devices 16 are shown in FIG. 1, however. Given the number and positioning of these compartments, carrier 10 is commonly referred to as a 1×5 carrier, but it will be clear to those skilled in the art that the number and position of the compartments may be varied, including placing compartments side by side to form a 2×5 configuration, for example. To the extent that each compartment is generally identical, a detailed description of the features of any given compartment will apply to the other four. For clarity of explanation, the five compartments shall be respectively referred to as compartments 20, 21, 22, 23, or 34, and each such designation will generally be followed by a "t" indicating that it is the compartment in carrier top 12, or "b" indicating that it is the compartment in carrier bottom 14.

As shown on FIG. 1, carrier bottom 14 has four, vertical side walls, 32a, 32b, 32c, 32d which are integrally formed with horizontal base 34. A portion of side wall 32d, however, has been sectioned away to better show this embodiment of the invention. Side walls 32a, 32c are generally parallel with each other, side walls 32b, 32d are also generally parallel with each other, and side walls 32a, 32c are each generally perpendicular to side walls 32b, 32d. Together with base 34 side walls 32a, 32b, 32c, 32d form a five sided, generally elongated, open, box-like tray.

Compartments 20b-24b are separated from each other by four, substantially identically configured, vertical, partitions 36, which run perpendicularly between side walls 32b, 32d and are parallel with side walls 32a, 32c. Each partition 36 terminates on either end with a column 40 so that there are eight columns 40 in carrier bottom 14. Due to the sectioning of FIG. 1, partition 36 separating compartments 23b and 24b is only partially visible, and also one of the columns 40 is not shown.

Column 40 is generally in the shape of a cylinder cut in half along its longitudinal axis. As seen in FIG. 1, the flat portion of the half cylinder is formed with side walls 32b, 32d, while the rounded portion of cylinder 40 is integrally formed with the ends of partition 36. The vertical wall formed by partition 36 is not as high as column 40, which is the same height as side walls 32b, 32d. The top portion of each column 40 forms tab 42, which is configured to fit within a matingly configured recess in carrier top 12 and will be discussed in greater detail below.

The four inner most columns 40, connected to the partitions 36 which separate compartments 21b and 22b, and compartments 22b and 23b, each have an identically configured jig bore 44. Jig bore 44 is a hollowed cylindrical cavity extending vertically and entirely through the longitudinal center of each of these four columns 40. They are configured to mate with four pins (not shown) which extend vertically upward from the assembly line jig (not shown) on which carrier bottom 14 is placed when it is integrated into an assembly line operation. Thus, after carrier top 12 is removed, carrier bottom 14 is positioned such that the matingly configured jig pins are inserted up through the underside of the jig bores 44. Carrier bottom 14 is thereby secured on the assembly line jig during assembly operations, and a robot (not shown) will remove devices 16 and mount them on a printed circuit board.

At either end of carrier bottom 14 are two relatively short, generally horizontal, extended portions of carrier bottom, bottom handles 46, 50. The free end of each has a short extension, handle lip 52, 54, respectively, which each extend downwardly at approximately 90 degrees from bottom handles 46, 50. Positioned on bottom handle 46 is alignment peg 56, and positioned on bottom handle 50 is alignment peg 60. Both alignment pegs 56, 60 extend vertically upward from the plane formed by bottom handles 46, 50, and fit within a matingly configured alignment hole in carrier top 12, as will be discussed further below.

As seen in FIG. 1, bottom handle 46 has chamfered corner 62, which results from configuring one corner of bottom handle 46 with a small, cut-away section. Bottom handle 50 does not have any such chamfered corner. The purpose behind chamfered corner 62 is to assist in correctly orienting carrier bottom 14 in the automated assembly process. In particular when device 16 is placed in carrier bottom 14, it is positioned so that the leads are in a particular orientation relative to carrier bottom 14. Then, when device 16 is lifted out of carrier bottom 14, the robot is programmed to place the device on the printed circuit board based on certain assumptions about the original positioning of the leads relative to carrier bottom 14. To the extent that carrier bottom 14 is otherwise generally symmetric around the y axis, without chamfered corner 62 it would be difficult to distinguish one end of carrier bottom 14 from the other. Therefore, chamfered corner 62 provides a distinguishing reference feature by which one end of carrier bottom 14 may be differentiated from the other, so that carrier bottom 14 can be correctly oriented on the assembly line.

Bottom handles 46, 50 each have a feeder hook hole, respectively numbered 63a, 63b. As will be discussed in greater detail below, when carrier top 12 and carrier bottom 14 are mated together, these holes align with corresponding holes in the handles of carrier top 12 (feeder hook holes 63c, 63d), and can be used for the purpose of pulling carrier 10 in another assembly line system.

Each of the compartments 20b-24b has a nest, generally designated 64, which is positioned within the given compartment on base 34. Nest 64, which is most clearly seen by reference to compartments 23b and 24b, is configured for mating insertion of the body 17 of device 16. More particularly, the underside of body 17 is supported by nest seat 70, which is a horizontal, flat surface with a portion cut out of its middle, forming a centrally positioned, rectangular depression 66 within nest seat 70. As shown only in FIG. 2, device 16 has a generally rectangular lid 67, which covers a portion of one side of body 17. Depression 66 forms a recess into which lid 67 is disposed.

Nest 64 also has four generally identical, vertical, nest walls 72a, 72b, 72c, 72d surrounding the perimeter of nest seat 70. Nest walls 72a-72d extend upwardly from base 34 and are high enough to engage the sides of body 17 of device 16 and prevent it from any horizontal movement. As will be shown and discussed in greater detail in connection with FIG. 2, nest walls 72a-72d are not high enough to contact leads 18 when device 16 is properly positioned in nest 64; therefore, leads 18 extend into free space within carrier 10. Generally, it can be seen in FIG. 1 by reference to compartments 23b and 24b that nest 64 provides a platform with walls for snugly holding devices 16.

Still referring to FIG. 1, carrier top 12 is complementarily configured to mate with carrier bottom 14. Similar to carrier bottom 14, carrier top 12 has five distinct compartments, designated 20t, 21t, 22t, 23t, or 24t as discussed above. Carrier op 12 has four, downwardly projecting, vertical side walls, 74a, 74b, 74c, 74d which are integrally formed with horizontal cover 76. A portion of side wall 74d, however, has been sectioned away in FIG. 1 to better show the features of this embodiment of the invention. Side walls 74a, 74c are generally parallel with each other, side walls 74b, 74d are also generally parallel with each other, and side walls 74a, 74c are each generally perpendicular to side walls 74b, 74d. Together with cover 76 side walls 74a, 74b, 74c, 74d form a five sided, elongated, open box-like cover. Similar to the compartment dividers in carrier bottom 14, compartments 20t-24t are separated from each other by four, identically configured, vertical partitions 78, which run between side walls 74b, 74d and are parallel with side walls 74a, 74c.

Side walls 74a-74d each have a horizontally extending brim, respectively referred to as brims 80a, 80b, 80c, 80d, each of which extends away from its respective side wall at approximately 90 degrees. Brims 80b, 80d each have four identically configured tab recesses 82; however, one of the tab recess 82 on side wall 74d is not shown because of the sectioning of FIG. 1. Tab recesses 82 are matingly configured to admit therein the corresponding eight tabs 42, discussed above in connection with carrier bottom 14. Therefore, when carrier top 12 is positioned on carrier bottom 14, tab recesses 82 work in registration with tabs 42 to properly align and seat carrier top 12 onto carrier bottom 14.

At either end of carrier top 12 are two relatively short, generally horizontally extending portions of carrier top 12, top handles 84, 86. The free end of each has a short extension, handle lip 90, 92, respectively, which each extend upwardly at approximately 90 degrees from top handles 84, 86. Formed in top handle 84 is alignment hole 94, and formed in top handle 86 is alignment hole 96. When carrier top 12 is mated with carrier bottom 14 in the proper orientation, alignment peg 56 on bottom handle 46 will coactingly engage alignment hole 94 on top handle 84. Correspondingly, alignment peg 60 on bottom handle 50 will similarly engage alignment hole 96 on top handle 86. This prevents the wrong ends of top 12 from being incorrectly mated with carrier bottom 14—such that bottom handle 46 would be mated with top handle 84 and bottom handle 50 would be mated with top handle 86—because alignment holes 94, 96 would not be aligned with a corresponding alignment peg 56 or 60. Consequently, carrier top 12 would not mount flushly on carrier bottom 14. Therefore, alignment holes 94, 96 together with alignment pegs 56, 60 aid in insuring that the top and bottom are mated in the correct orientation relative to one another.

Similar to bottom handle 46, top handle 84 has chamfered corner 98 which is virtually identical to chamfered corner 62, except that it is on top handle 84. When carrier top 12 and carrier bottom 14 are mated, chamfered corners 62, 98 will align precisely, thus giving carrier 10 the distinctive physical feature by which one end of carrier 10 can be differentiated from the other, as discussed above.

In addition, top handles 84, 86 respectively have feeder hook holes 63c, 63d, which are generally centrally located in the handles. When carrier top 12 is mated with carrier bottom 14 feeder hook hole 63a of bottom handle 46 will align with feeder hook hole 63c of top handle 84. Correspondingly, feeder hook hole 63b of bottom handle 50 will align with feeder hook hole 63d of top handle 86. The alignment of these corresponding holes will result in a hole extending through the adjacent handles of carrier 10 when it is closed. These feeder hook holes 63a-63d are also used in the assembly line operations for moving carrier 10 around. More specifically, a feeder hook (not shown) can be disposed through the hole for the purpose of moving carrier 10 in a given direction for enabling carrier 10 to be grasped and maneuvered in the automated assembly operation.

Figure 2:
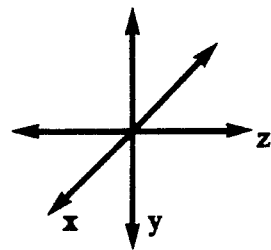
FIG. 2 is a side sectional view of the carrier in FIG. 1 shown in its assembled condition as viewed generally along the line 2—2 of FIG. 1.
Figure 2:
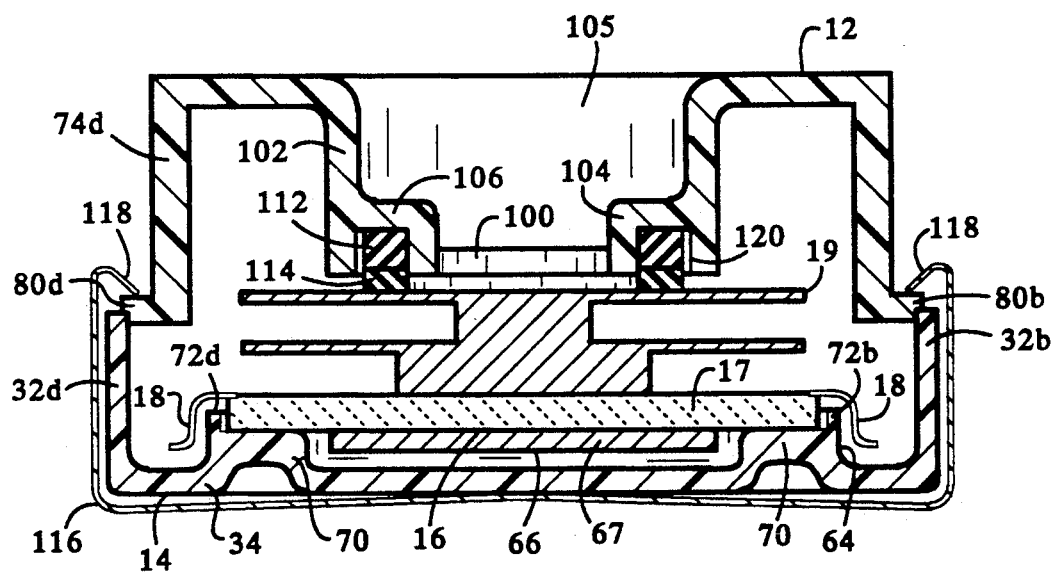

Compartments 20t-24t each have an identically configured hold-down member, generally designated 100, which engages the top of heat sink 19, when device 16 is seated in nest 64 and carrier top 12 is mated with carrier bottom 14. As is best shown in FIG. 2, when these elements are so positioned, device 16 is secured firmly in nest 64 and the compressive force of hold-down member 100 against heat sink 19 prevents device 16 from any vertical movement.

Hold-down member 100 is best discussed by reference to compartment 21t, which shows hold-down member 100 because side wall 74d has been partly sectioned away, and compartment 22t which shows a partly sectioned view of hold-down member 100. Hold-down member 100 is formed of an outer sleeve 102 and an inner sleeve 104. Outer sleeve 102 is generally shaped like a hollowed cylinder, having a given diameter, which extends downwardly from its attachment with cover 76. When cover 76 is viewed from the top, it will have five holes, corresponding to the five hold-down members 100, leading down to a short cylindrical cavity 105 which has the same diameter as outer sleeve 102. Cavity 105 is partly visible in the sectioned portion of hold-down member 100 positioned in compartment 22t.

Extending radially inward from outer sleeve 102 is support ring 106, which is a ring shaped support means attached to outer sleeve 102 along the perimeter of its outer diameter and it extends 90 degrees relative to the hollow cylinder forming outer sleeve 102. At the inner most diameter of support ring 106, the walls of inner sleeve 104 extend downward at 90 degrees relative to support ring 106. Like outer sleeve 102, inner sleeve 104 is also generally shaped like a hollowed cylinder, having a diameter that is smaller, but coaxially aligned with the diameter of outer sleeve 102. With the diameters of both inner sleeve 104 and outer sleeve 102 on the same axial centerline, the walls of sleeves 102, 104 are parallel with each other. The downward extension of inner sleeve 104 is long enough so that the bottom edges of the cylinders forming inner sleeve 104 and outer sleeve 102 are horizontally co-planar.

The positioning and connection of outer sleeve 102, inner sleeve 104, and support ring 106 forms an annular, or ring shaped, channel 110. Each channel 110 admits therein two rings, compression ring 112 and contact ring 114. On FIG. 1, channel 110 is best seen by referring to those hold-down members 100 in which the compression rings 112 and contact rings 114 have been removed through the exploded view, namely compartments 20t, 21t, 23t, 24t. In compartment 22t channel 110 is partly visible; however, the sectioned portions of the compression ring 112 and contact ring 114 are inserted in channel 110 as they would be when carrier top 12 is put together.

Compression ring 112 is a rubber like quad ring, meaning that a cross sectional cut of one portion of the ring reveals a rectangular shaped. In accordance with the present invention, compression ring 112 is made of Buna N rubber; however, it will be clear to those skilled in the art that other materials could be used with equally advantageous effect. Such other materials should have a durometer which is between 50-80 on the Shore A scale, with a preferred durometer of 70. As will be detailed in connection with the discussion of FIG. 2, compression ring 112 is configured and dimensioned so that its inner diameter fits snugly around inner sleeve 104, but there is some room between its outer diameter and outer sleeve 102. More particularly, the fit is not so tight that compression ring 112 loses its ability to compressively, but elastically, deform.

Contact ring 114 is made from a hard material which is rigid and has no appreciable ability to elastically compress. The conductive, polycarbonate resin used for carrier 10 has been found to be a suitable material for making contact ring 112; however, other materials can be used. It, too, has a quad ring shape and is configured and dimensioned to fit snugly around inner sleeve 104, with some space separating its outer diameter from outer sleeve 102.

An important property of the material forming contact ring 114 is that the material does not stick to the top surface of heat sink 19 when carrier top 12 is separated from carrier bottom 14. The temperature and humidity of the environment in which carrier 10 is used, as well as the composition of the contact surface of device 16, are all factors which may effect the tendency of contact ring 114 to stick to heat sink 19. Given that contact ring 114 does not have to itself have any particular elastic qualities, the material out of which it is made can be selected on the basis its non-stick character.

When carrier top 12 is fully assembled, in the manner indicated by the exploded view shown in FIG. 1, compression ring 112 is first inserted into channel 110 so that it abuts support ring 106 and is positioned between the cylindrical walls forming outer sleeve 102 and inner sleeve 104. Then, contact ring 114 is similarly inserted into channel 110 so that it abuts compression ring 112 and is likewise positioned between outer sleeve 102 and inner sleeve 104. As will be detailed in connection with FIG. 2, although contact ring 114 is in abutting relation with compression ring 102, a portion of contact ring 114 downwardly protrudes from the bottom edges of sleeves 102, 104. In order to secure both rings 112, 114 in place, an adhesive such as the adhesive sold under the brand name Loctite 401, for example, may be used to affix compression ring 114 to support ring 106, and contact ring 116 to compression ring 112.

Also shown in FIG. 1 are three spring clamps 116, which are for securing carrier top 12 and carrier bottom 14 together when carrier 10 is closed. Spring clamps 116 are bent bands of metal which each have two clamp hooks 118 on either. Clamp hooks 118 are generally in the shape of an inverted J. In addition, the middle portion of spring clamp 116 is bowed inwardly. The actual attachment of spring clamps 116 to carrier 10 is best shown in FIG. 2.

Referring now to FIG. 2, carrier 10 of FIG. 1 is shown in a side sectional view. The sectional view shown in FIG. 2 is based on closing and clamping carrier 10 of FIG. 1 with device 16 in compartment 20 and sectioning carrier 10 along Line 2—2 by means of a plane which is parallel to the plane established by the y-z axes. The view if FIG. 2 is in the direction of the arrows at the ends of Line 2—2. FIG. 2 also contains the same type of orientation key shown in FIG. 1; however, it can be seen that the positioning of the x axis and the z axis has been reversed based on the different orientation of FIG. 2 relative to FIG. 1.

As shown in FIG. 2, device 16 is seated in nest 64. More particularly the underside of body 17 is supported by nest seat 70. Nest walls 72b, 72d are shown to snugly surround the lower perimeter of body 17, and although they are not visible in FIG. 2, nest walls 72a, 72c are similarly situated with respect to the other two sides of body 17. Provided nest walls 72a–72d are configured in accordance with the dimensions of body 17, when body 17 is seated in nest 64 device 16 will be prevented from horizontal movement by the lateral contact of body 17 with nest walls 72a–72d.

As discussed above, nest walls 72a–72d do not extend high enough along the side of body 17 to make contact with the leads 18 protruding from the side of body 17. Leads 18 are thereby freely suspended in space. This is highly important given that leads 18 are very delicate and must be protected from any obstruction or contact that may bend them out of precise alignment.

Also as discussed above, when compression ring 112 and contact ring 114 are positioned in channel 110 of hold-down member 100, contact ring 114 is in fact only partially inserted in channel 110 because it extends below the horizontally, co-planar, bottom edges of outer sleeve 102 and inner sleeve 104. Therefore, when devices 16 are seated in nests 64 and carrier top 12 is mated with carrier bottom 14, each contact ring 114 will engage the central portion of the top surface of its respective heat sink 19. When contact ring 114 so engages heat sink 19 it does so by applying compressive downward force through a contact surface that is generally uniformly and symmetrically positioned around the center point of the top surface of heat sink 19.

In the present invention, contact ring 114 is the component that actually makes contact with device 16, while compression ring 112 gives hold-down member 100 its resilient, or shock absorber-like, qualities. When contact ring 114 moves due to contact pressure with the top of heat sink 19, or due to shock or vibration, the rubber-like qualities of compression ring 112 will elastically deform to absorb that force or vibration. Moreover, compression ring 112 will force contact ring 114 downward against heat sink 19, tending to urge device 16 into nest seat 70. In this respect, hold down member 100 is responsible for restricting the movement of device 16 along the y axis.

It will be clear to those skilled in the art that the force of contact ring 114 will cause sufficient compressive contact of device 16 and nest 64 that the friction force of the bottom side of body 17 and nest seat 70 will also have a tendency to inhibit the lateral movement of device 16. In this respect, hold-down member 100 not only restricts the movement of device 16 vertically, but laterally as well.

As shown in FIG. 2, the inner diameters of compression ring 112 and contact ring 114 are both dimensioned such that they snugly surround the outer cylindrical wall of inner sleeve 104. On the other hand, the outer diameters of compression ring 112 and contact ring 114 do not extend far enough to contact the inner cylindrical wall of outer sleeve 102 when rings 112, 114 are in a normal, uncompressed condition. Consequently, there is a small space between the outer diameters of rings 112, 114 which is compression space 120. Compression space 120 is necessary in order to give compression ring 112 adequate free space into which it can expand, or bulge, when it is compressed under contact force. In other words, when hold-down member 100 is positioned on top of device 16 as carrier top 12 is mated with carrier bottom 114, the compressive force will cause compression ring 112 to bow out along its outer diameter, extending into compression space 120.

Hold-down member 100 must be configured to accommodate the vertical height of device 16; however, to the extent compression ring 112 is made of a rubber like material, carrier 10 is able to accommodate dimension tolerances within certain limits. When device 16 is seated in nest 64 and carrier top 12 is mated with carrier bottom 14 the vertical height of the bottom surface of contact ring 114 must be dimensioned to account for the vertical height of the top of heat sink 19 so that it engages heat sink 19 with the right degree of compressive force. This force must be enough to securely hold device 16 in place, but it cannot be so great that it causes damage to device 16 by crushing or cracking the ceramic package, for example.

Each device 16 which can be stored and transported in carrier 10 has a definable contact surface area which is available for contact by ring 114. Hereinafter "available contact area" means that amount of surface area on a given device 16 which can be compressively contacted by contact ring 114 with device 16 seated in nest 64 without damaging device 16. For example, some devices, which have their leads extending from their sides, may have an entire surface, such as the top surface, as an available contact area. Other devices, which have their leads extending out of the top of the device, would not have the full top surface of the device available for compressive contact because contact on the leads would probably damage them. Accordingly, on the latter device the available contact area is defined by an area inside a perimeter established by the connection of the leads with the top of the device. Still another device may have a heat sink, which would provide a different available contact area.

Given that in different device configurations there may be different available contact areas, and given that in different embodiments of the invention the diameter and width of contact ring 114 may vary, the exact percentage of the available contact area on a given device, which is contacted by ring 114, may vary. In certain applications of the invention, the surface area of contact of contact ring 114 with the available contact area on device 16 has ranged between 17 and 27 percent, approximately.

Although in other embodiments of the invention this percentage may vary beyond these ranges, it is an important feature of the invention that a large enough percentage is contacted so that contact ring 114 can evenly distribute the compressive force over a substantial portion of the available contact area. Such even and substantial distribution of force is necessary to insure that in robust transportation conditions device 16 remains properly seated in nest 64. Moreover, although the dimension of ring 14 relative to the available area of device 16 may vary, it is preferable that the diameter of ring 114 is small enough so that the entire contact surface of contact ring 114 engages the available contact area, and none of ring 114 over hangs the available contact area.

To the extent that hold-down member 100 can accommodate IC devices with differing available contact areas, within the limitations discussed, carrier 10 is more universally adaptable to changes in IC device configurations than carriers that hold down specific points on the device. Consequently, from one generation of IC devices to another, it may be possible to use the same carrier 10 even though the available contact area has gotten smaller or larger.

For example, if the dimensions of a subsequent generation of a given device remains the same as an earlier generation, except that the disk shaped heat sink of the newer device has a larger diameter, for example, a carrier 10 originally configured for the earlier generation could also accommodate the newer device. Alternatively, it may be possible to use an old carrier top 12 with a new carrier bottom 14, which admits a new device 16 in an appropriately configured nest 64, thus saving on the retooling cost of a new carrier top. In any such adaptations it will be necessary to make sure that the vertical dimensions are suitable so that contact ring 114 engages device 16 with the appropriate force, as discussed above.

After devices 16 are enclosed in carrier 10, spring clamps 116 are used to secure top 12 and bottom 14 together. More specifically, clamp hooks 118 are placed over the tops of brims 80b, 80d such that the metal band forming spring clamp 116 wraps around the underside of carrier bottom 14. Also seen in FIG. 2, spring clamps 116 is slightly bowed so that its spring action has a tendency to urge carrier bottom 14 in closer contact with carrier top 12, thereby keeping top 12 and bottom 14 secured together during transportation.

During transportation carrier 10 may be subjected to moderate, average, even severe or "robust" transportation conditions, as the term robust is hereinafter defined. Such robust conditions typically result from dropping, bouncing and vibration during handling and shipment in a vehicle, such as a delivery van.

In order to test the suitability of carrier 10 to protect device 16 in a robust transportation environment, devices 16 were positioned in eight carriers 10, as described above, and the carriers 10 were then placed inside a shipping carton (not shown). The shipping carton was a generally available, commercial shipping carton, made of ⅛ inch thick corrugated cardboard with outer dimensions of 8.5×11×5.5 inches. The packing material around the carriers 10 was four pieces of foam measuring 8×10.5×¾ inches. The foam was a static dissipative polyurethane having 1.7 pounds per cubic foot (pcf) density and 40-45 pounds indentation load diflection (ILD). When packed, the bottom of the carton was fitted with the first piece of foam, then four carriers 10 placed side by side, then another piece of foam, then four more carriers 10 also placed side by side, then the two remaining pieces of foam placed on top. The carton was then taped with commercial packing tape.

The test sample carton was then subjected to laboratory vibration, drop, and bounce tests, which simulate real transportation conditions. Although the term "robust", as used herein, is in part defined by reference to the physical conditions created by the specific tests described below, "robust" is also defined to include different laboratory tests or actual transportation conditions which subject device 16 and carrier 10 to equivalent physical forces. Of course, although the ability of carrier 10 to withstand robust transportation conditions is focused upon, it is obvious that carrier 10 is suitable for use in a transportation environment in which the conditions are less severe than robust.

During the tests, the test sample was subjected to vibration, which was random in terms of its frequency and amplitude, ranging from 5-300 Hz, with an overall level of 1.194 GRMS. These levels were applied to the test sample along three mutually perpendicular axis for one hour per axis, or a total of three hours. In the drop test the samples were dropped onto a concrete floor on the three edges of a given corner of the carton and all six faces of the cartons from a height of thirty inches. Additionally, the test sample was bounced on a bounce table having a total excursion of one inch. The vibration frequency was set so that the sample momentarily left the table so that a 1/16 inch thick, 2 inch wide metal shim could be inserted at least 4 inches between the sample and the table. The sample was bounced for approximately 32 minutes and then rotated 90 degrees horizontally and bounced another 32 minutes for a total of 14,200 impacts.

After subjecting the sample to this testing, the devices, including their fragile, preformed leads 18, inside carrier 10 were found to be undamaged. Importantly, because contact ring 114 distributes the compressive force over an entire surface area of contact, devices 16 are forced to remain seated in nest 64 even when carrier 10, packaged within an ordinary shipment carton, is subjected to robust transportation conditions.

The present invention has been discussed in connection with a carrier for devices having preformed leads and disk shaped heat sinks. Other embodiments of the invention are possible in which the IC device does not have preformed leads. The present invention is particularly suitable for device with preformed leads, however, because it cradles the device so securely that even the delicate preformed leads will remain undamaged. IC devices with unformed leads, which tend to be more durable than preformed leads, can therefore be easily accommodated by the present invention. In addition, the present invention can be configured to accommodate an IC device that has a different shaped heat sink, such as a rectangular heat sink, or no heat sink at all.

Hold-down member 100 has been described as having two rings which are responsible for engaging device 16. In another embodiment of the present invention, the elements which contact device 16 need not be ring shaped, rather they, too, may be another shape, such as rectangular for example.

Also, although the contact ring 114 and the compression ring 112 are two separate elements in the preferred embodiment, it is also possible for the two rings to be replaced by one. This would be possible provided the side that contacts device 16 is comprised of a material which will not stick to device 16 under the environmental conditions to which the carrier and device 16 are exposed, and provided the non contact side is compliant enough to give the hold-down member the required resilience. A Buna N rubber compression ring, as discussed above, with a coating of a modified tungsten disulfide, such as that sold by Dicronite Dry Lube Northeast of Westfield, Mass. has yielded satisfactory results. Although only the side of compression ring 112 which contacts body 17 of device 16 needs to be coated, it has been found that the coating can be deposited over the entire compression ring 116 without adversely affecting its durometer. Such a coating approach is simpler than coating only one surface.

Accordingly, the invention in its broader aspects is therefore not limited to the specific details, representative apparatus, and illustrative examples shown and described herein. Departures may be made from such details without departing from the spirit or scope of the invention.

What is claimed is:

1. A carrier apparatus for containing and transporting an integrated circuit device, the device having a body with a first and second side, said apparatus comprising:
   a first enclosure member having nesting means matingly designed for seating the first side of the body;
   a second enclosure member, configured for mating combination with said first enclosure member for forming an enclosed carrier apparatus, said second enclosure member having an outer and inner surface; and
   hold-down means having a support member and a resilient compression means, said compression means being coated with a non-stick material, said hold-down means being mounted on said inner surface of said second enclosure member such that with said first and second enclosure members matingly combined, said compression means is compressed between said support member and the second side of the body, and a coated portion of said compression means contacts the second side of the body and applies sufficient force to keep the device securely seated in said nesting means during transportation.

2. The apparatus as in claim 1, wherein said compression means comprises a compression ring.

3. The apparatus as in claim 2, wherein said compression ring has a durometer of 50–80 on the Shore A scale.

4. A carrier apparatus for containing and transporting an integrated circuit device, the device having a body with a first and second side, said apparatus comprising:
   a first enclosure member having nesting means matingly designed for seating the first side of the body;
   a second enclosure member, configured for mating combination with said first enclosure member for forming an enclosed carrier apparatus, said second enclosure member having outer and inner sides;
   hold-down means having outer and inner walls which are each attached at one end to said inner side of said second enclosure member, said outer and inner walls being separated from one another by a channel; and
   said hold-down means further having resilient compression means and contact means with a predetermined area, said compression means being disposed within said channel and said contact means mounted on said compression means, such that with said first and second enclosure members matingly combined and the device seated in said nesting means, said contact means makes contact with the second side of the body and said compression means applies sufficient force through said contact means to keep the device securely seated in said nesting means during transportation.

5. The apparatus as in claim 4, wherein said inner and outer walls are cylindrically shaped, and said inner and outer cylindrical walls are on the same axial center line.

6. The apparatus as in claim 5, wherein said compression means comprises a compression ring.

7. The apparatus as in claim 6, wherein said compression ring has a durometer of 50–80 on the Shore A scale.

8. The apparatus as in claim 6, wherein said compression ring is comprised of Buna N rubber.

9. The apparatus as in claim 6, wherein said contact means is comprised of a coating of a non-stick material on said compression ring.

10. The apparatus as in claim 9, wherein said coating is comprised of a modified tungsten disulfide.

11. The apparatus as in claim 6, wherein said contact means comprises a contact ring, said contact ring being affixed to said compression ring such that said contact ring extends beyond the edges of said cylindrical walls.

12. The apparatus as in claim 11, wherein said contact ring is comprised of a non-stick material.

13. The apparatus as in claim 12, wherein said non-stick material is comprised of a conductive, polycarbonate resin.

14. The apparatus as in claim 4, wherein one of said enclosure members has an alignment peg and the other of said enclosure members has an alignment hole, said peg and hole being positioned with respect to one another such that with said first and second enclosure members properly mated said peg passes through said hole.

15. A carrier apparatus for containing and transporting an integrated circuit device, the device having a body with a first and second side, the second side of the body having a plurality of leads extending therefrom such that the contact of those leads with the second side defines the outer perimeter of an available contact area of the device, said apparatus comprising:
- a first enclosure member having nesting means matingly designed for seating the first side of the body;
- a second enclosure member, configured for mating combination with said first enclosure member for forming an enclosed container, said second enclosure member having outer and inner sides; and
- hold-down means having non-stick contact means, with a predetermined area, and resilient compression means, said hold-down means being mounted on said inner side of said second enclosure member such that with said first and second enclosure members matingly combined and the device seated in said nesting means, said compression means is positioned between said inner side of said second enclosure member and said contact means, and said contact means contacts the device within the available contact area.

16. The apparatus as in claim 15, wherein said contact means comprises a coating on said compression means.

17. The apparatus as in claim 16, wherein said coating is comprised of a modified tungsten disulfide.

18. The apparatus as in claim 15, wherein said compression means has a durometer of 50-80 on the Shore A scale.

19. The apparatus as in claim 15, wherein said compression means is comprised of Buna-N rubber.

20. The apparatus as in claim 15, wherein said compression means comprises a compression ring.

21. The apparatus as in claim 20, wherein said contact means is comprised of a contact ring.

22. The apparatus as in claim 21, wherein said contact ring is comprised of a conductive, polycarbonate resin.

* * * * *